(12) United States Patent
Balko et al.

(10) Patent No.: US 6,836,108 B1
(45) Date of Patent: Dec. 28, 2004

(54) THREE-PHASE ELECTRICITY METER INCLUDING INTEGRAL TEST SWITCH

(75) Inventors: Norbert H. Balko, Harrison City, PA (US); Jeffery F. Fye, DuBois, PA (US); Jeffrey L. Fischer, DuBois, PA (US); Matthew E. M. Storkey, Trumpington Cambridge (GB); Edward G. Colby, Cambridge (GB)

(73) Assignee: M & FC Holding, LLC, Raleigh, NC (US)

( * ) Notice: Subject to any disclaimer, the term of this patent is extended or adjusted under 35 U.S.C. 154(b) by 0 days.

(21) Appl. No.: 10/699,806

(22) Filed: Nov. 3, 2003

(51) Int. Cl.[7] .................................................. G01R 7/00
(52) U.S. Cl. ...................................................... 324/142
(58) Field of Search ..................... 324/142, 74, 158.1, 324/765; 702/45, 60, 61, 182; 340/605

(56) References Cited

U.S. PATENT DOCUMENTS

| | | | |
|---|---|---|---|
| 5,644,222 A | 7/1997 | Dohmstreich et al. | 324/74 |
| 6,414,475 B1 | 7/2002 | Dames et al. | 324/127 |
| 6,488,535 B1 * | 12/2002 | Robinson et al. | 439/517 |
| 6,493,644 B1 * | 12/2002 | Jonker et al. | 702/61 |
| 6,687,627 B1 * | 2/2004 | Gunn et al. | 702/61 |
| 6,734,663 B2 * | 5/2004 | Fye et al. | 324/142 |

OTHER PUBLICATIONS

"An Analysis of ANSI (Single Phase/Series–Parallel) and IEC (True Polyphase) Test Methods for Electricity Meters", UTEC, Jun. 1998, pp. 1–7.

"Testing Polyphase Meters: ANSI & IEC Standards" [Issue 3, 2002], web site printout, pp. 1–4.

* cited by examiner

*Primary Examiner*—David Zarneke
*Assistant Examiner*—Tung X. Nguyen
(74) *Attorney, Agent, or Firm*—Andrus, Sceales, Starke & Sawall, LLP

(57) ABSTRACT

A three-phase electricity meter that includes an integral test switch member that allows the electricity meter to be tested without accessing the enclosed meter housing. The test switch member is operable to move a plurality of contact members into and out of engagement with the bus bars of the electricity meter. Specifically, each contact member includes a flexible finger that is biased into contact with one of the bus bars. When the test switch member is moved from the operating position to the testing position, each of the flexible fingers is moved away from its biased position against the bus bar. Each of the contact members includes a connecting pin that is accessible from the exterior of the meter housing such that separate test voltages and currents can be supplied to the electricity meter without accessing the enclosed meter housing.

17 Claims, 3 Drawing Sheets

THREE-PHASE ELECTRICITY METER INCLUDING INTEGRAL TEST SWITCH

BACKGROUND OF THE INVENTION

The present invention generally relates to an electricity meter for monitoring the amount of consumed electricity. More specifically, the present invention relates to a three-phase electricity meter incorporating a test switch that allows for meter testing without accessing the meter housing.

Presently, three-phase meters are available for monitoring the amount of three-phase electricity consumed by a facility. Typically, three-phase electricity meters are provided for large residential or industrial applications. A typical three-phase electricity meter monitors the amount of electricity consumed by the facility over each of the three phases of the supplied electricity. The three-phase electricity meter includes internal circuitry that monitors the amount of electricity consumed over each of the three phases of the power supply. Many different types of measurement circuits have been developed to accurately measure the amount of electricity consumed over each of the three phases.

Since three-phase electricity meters are often used in locations that consume a large amount of power, electrical utilities have a great incentive to test the three-phase electricity meters for accuracy prior to the installation of the three-phase electricity meter in the field.

The testing of a three-phase electricity meter typically involves placing the three-phase electricity meter into a test circuit and supplying high levels of both voltage and current to the electricity meter to determine whether the electricity meter is properly measuring the amount of consumed electricity. Typically, the test circuit is designed such that the circuit can supply both high voltage over the three phases and a high amount of current. Test circuits of this type are typically very expensive, which increases the cost for the utility.

In an attempt to avoid utilizing the expensive testing circuit described above, utilities test three-phase meters by utilizing separate current and voltage sources. The circuitry required to supply separate voltage and current sources is significantly less expensive and less bulky. When utilizing separate voltage and current sources, the internal contacts within the electricity meter must be altered during the testing. Typically, this requires testing personnel to isolate the voltage input circuits from the current inputs by physically opening individual links connected to each phase on the meter. Once the testing is complete, the electricity meter is returned to its normal condition by reversing this procedure. This testing process is labor intensive and thus increases the cost to test each of the three-phase electricity meters.

Therefore, it is an object of the present invention to provide an electricity meter that can be tested utilizing separate high voltage and high current supplies. Further, it is an object of the present invention to provide a three-phase electricity meter that includes the ability to alter the internal connections simultaneously, thereby reducing the number of operations by a factor of three.

SUMMARY OF THE INVENTION

The present invention is directed to a three-phase electricity meter that is operable to measure and display the amount of consumed three-phase electricity at either a residence or industrial facility. The three-phase electricity meter is configured to be received within a conventional socket-type location such that the flow of three-phase electricity passes through the meter before being consumed at the facility. The three phase electricity meter includes a meter housing having a base member and a cover member. Preferably, the meter housing is enclosed and sealed such that the operating circuitry contained within the meter housing is protected from the environment.

The electricity meter of the present invention includes an internal circuit board that is enclosed within the housing and includes the measurement and operating circuitry required to determine the amount of three-phase electricity consumed by the facility. Typically, the measurement circuitry is mounted on one side of the circuit board, while the various contacts required to receive the supply of three-phase electricity are connected to the back side of the circuit board.

The electricity meter of the present invention includes three separate bus bars that each include a pair of connection blades that extend through the back, base plate of the meter housing. Each of the bus bars typically includes two spaced blades that are positioned in a configuration such that the electricity meter can be received within a conventional socket-type receptacle. As indicated, the blades on each of the bus bars extend through the base plate of the meter housing such that the meter housing does not need to be opened to access the blades of the bus bars.

A plurality of contact members are contained within the open interior of the meter housing, each of which provide an electrical connection between one of the bus bars and the circuit board. Preferably, each of the contact members is associated with only one of the bus bars such that each bus bar is coupled to the circuit board independently from the other remaining bus bars.

In accordance with the present invention, each of the contact members includes a first end that is in contact with the circuit board and a second end that is biased into contact with one of the bus bars. Specifically, a flexible finger is formed on each contact member from a material having a pre-stressed configuration such that the second end of the flexible finger is biased into contact with one of the bus bars. During normal operating conditions, the contact between the flexible finger of the contact member and the bus bar provides an electrical path between one of the bus bars and the circuit board contained within the electricity meter.

The electricity meter of the present invention includes a test switch member that is movable between a testing position and an operating position. When the test switch member is in the operating position, each of the contact members is in contact with one of the bus bars such that electricity can flow from the bus bars to the circuit board.

When the test switch member is moved to the testing position, the single test switch member moves each of the flexible fingers of the contact members out of contact with the respective bus bars such that the electrical interconnection between the bus bars and the circuit board is interrupted. The test switch member includes a plurality of engagement posts for engaging the flexible fingers of the contact members. Specifically, the flexible finger of each contact member is entrapped between a pair of the engagement posts. When the test switch member is moved to the testing position, the engagement post moves the flexible fingers away from and out of contact with the respective bus bars.

Each of the contact members includes a connecting pin that is accessible from the exterior of the enclosed housing for the electricity meter. The connecting pins provide a point of attachment for a supply of voltage to be fed into the electricity meter. During test conditions, the test switch member is moved to its testing position to separate the flexible finger of each contact member and the respective bus bars. Once the electrical connection is broken between the contact members and the bus bars, a test voltage can be selectively applied to each of the contact members through the respective connecting pins. At the same time, a separate test current can be applied to each of the bus bars such that separate sources for the current and voltage can be used to test the electricity meters.

In accordance with the present invention, the bus bars can be isolated from the circuit board by moving a single test switch member that is accessible from the exterior of the enclosed meter housing. Once the bus bars have been isolated, a test voltage or current can be supplied to the electricity meter from exterior to the enclosed housing. After testing is complete, the test switch member can be moved to the operating position and the electricity meter put into field service.

Various other features, objects and advantages of the invention will be made apparent from the following description taken together with the drawings.

BRIEF DESCRIPTION OF THE DRAWINGS

The drawings illustrate the best mode presently contemplated of carrying out the invention.

In the drawings.

DETAILED DESCRIPTION OF THE INVENTION

Figure 1:
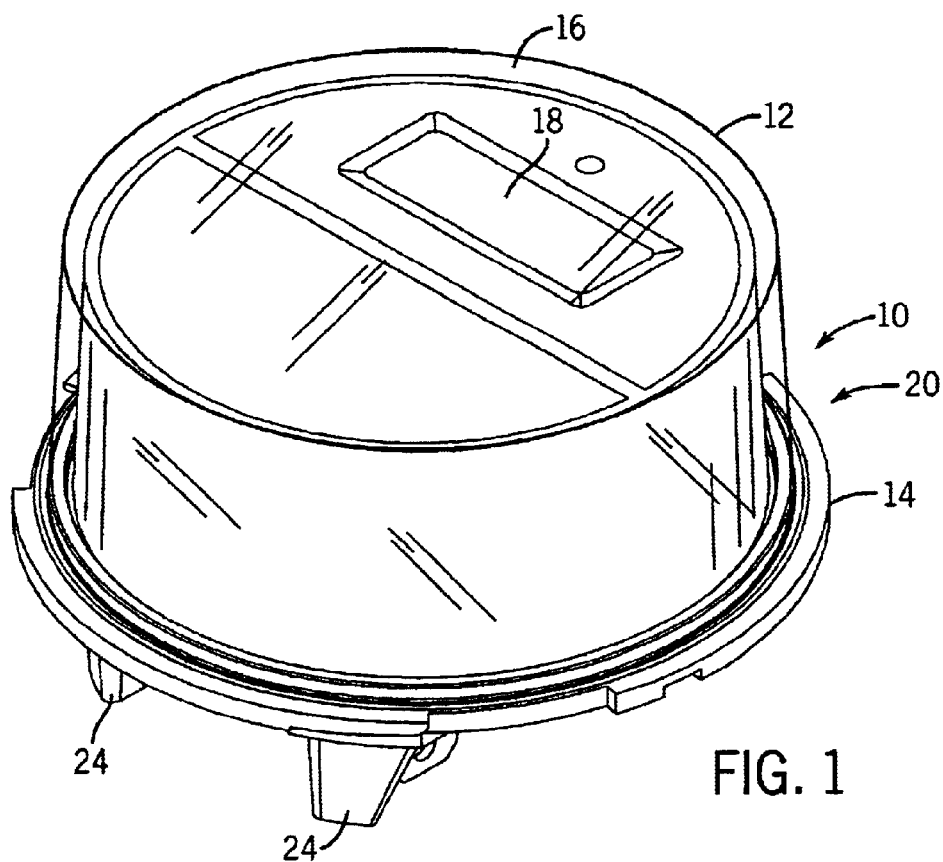
FIG. 1 is a perspective view of a three-phase electricity meter of the present invention.

FIG. 1 illustrates a three-phase electricity meter 10 constructed in accordance with the present invention. The electricity meter 10 includes an enclosed meter housing comprised of a cover member 12 mounted to a base member 14. The cover member 12 includes a generally clear face surface 16 that allows a digital display 18 to be read from the exterior of the electricity meter 10. The cover member 12 and base member 14 are joined to each other in a conventional manner such that the base member 14 and cover member 16 define a sealed, meter housing 20. The meter housing 20 prevents moisture and other environmental contaminants from reaching the internal circuitry contained within the three-phase electricity meter 10.

In the present invention, an operating and measurement circuit is contained within the meter housing 20 and operates to control the digital display 18. The specific details of the measurement circuit will not be described in detail, since the measurement circuitry forms no part of the present invention. However, it should be understood that the measurement circuit is well known to those skilled in the art and can vary depending upon the type of information required from the electricity meter 10.

Figure 2:
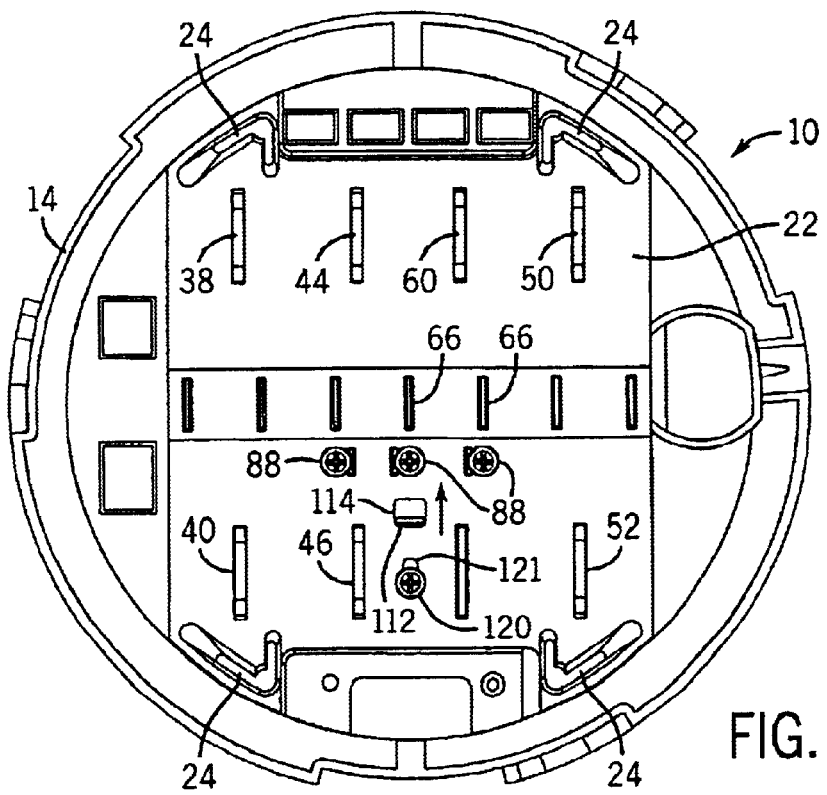
FIG. 2 is a back view of the three-phase electricity meter showing the bus bar connections and actuating tab of the test switch member.

Referring now to FIG. 2, thereshown is a bottom view of the electricity meter 10 of the present invention. The electricity meter 10 includes a generally planar base plate 22 that is formed as part of the base member 14. The base plate 22 includes a plurality of support legs 24 spaced evenly around the base plate 22. The support legs 24 stabilize the electricity meter 10 when the electricity meter is installed in either a residential or commercial location. The support legs 24 are typically formed from molded plastic and are formed integrally with the remaining portions of the base member 14.

Figure 3:
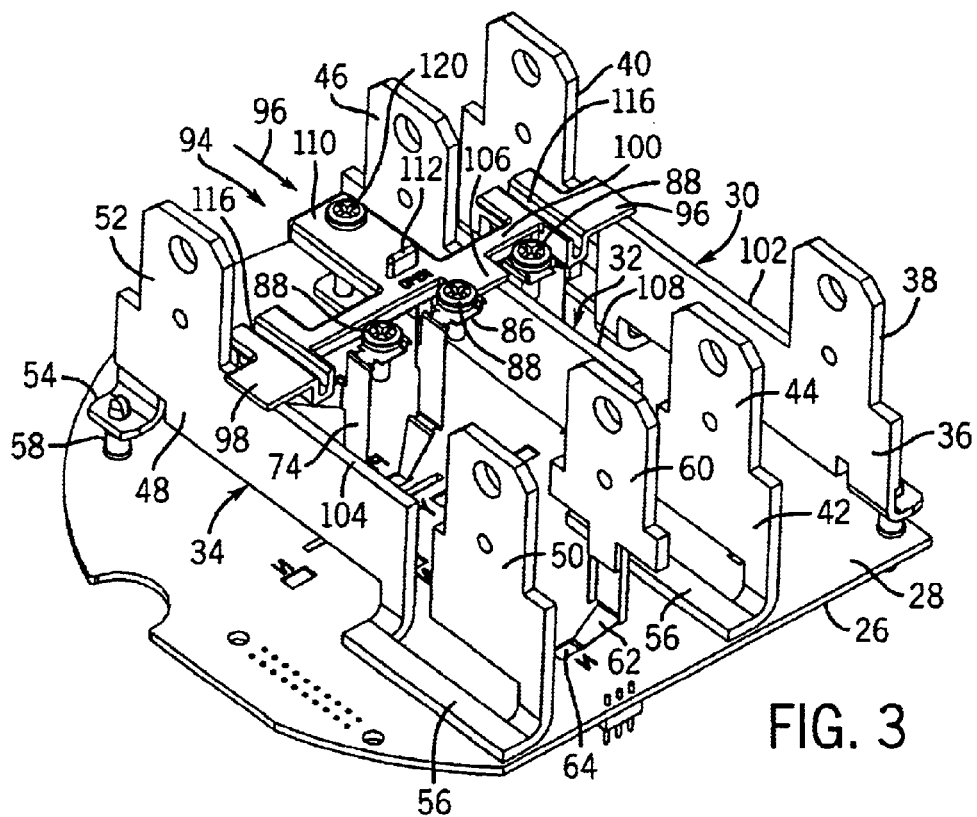
FIG. 3 is a bottom perspective view of the circuit board and bus bars of the electricity meter, further illustrating the position of the test switch member relative to the bus bars.

FIG. 3 illustrates the internal interface components for the three-phase electricity meter of the present invention. As shown in FIG. 3, the internal interface components of the electricity meter of the present invention provide the required connections between a socket (not shown) at the residence or commercial site and the internal circuit board 26. The circuit board 26 includes a front face surface (not shown) and a back, attachment surface 28. The front surface of the circuit board 26 includes electrical traces and the operating and measurement circuit of the electricity meter of the present invention. The electronic circuitry mounted to the front surface of the circuit board 26 allows the electricity meter to monitor, measure and display the amount of electricity used by the residence or commercial facility being monitored by the electricity meter. The operating circuit used to monitor the amount of electricity consumed can be of known configuration and generally forms no part of the present invention.

Referring back to FIG. 3, the circuit board 26 is connected to and supports a first bus bar 30, a second bus bar 32 and a third bus bar 34. Each of the bus bars 30, 32 and 34 is configured to receive one phase of a three-phase supply of electricity. The consumption of the three phases of the supplied electricity are measured by the electricity meter of the present invention and the amount of electricity consumed for each of the three phases is displayed on the digital display 18 shown in FIG. 1.

Referring back to FIG. 3, the first bus bar 30 includes a main body 36 having a first projecting blade 38 and a spaced, second projecting blade 40. The pair of blades 38, 40 are spaced from each other by a distance dictated by the type of socket into which the electricity meter of the present invention will be inserted. The pair of blades 38, 40 provide a point of connection between the electricity meter of the present invention and the supply of electricity being monitored.

The second bus bar 32 also includes a main body 42 and a pair of projecting blades 44 and 46. The second pair of blades 44, 46 are generally in line with the first pair of blades 38, 40. The third bus bar 34 likewise includes a main body 48 having the pair of spaced blades 50 and 52.

Referring back to FIG. 2, the individual blades of the three bus bars extend through the base plate 22, as illustrated. The blades of the bus bars are configured to be received in a standard socket such that the electricity meter can be plugged into the socket and can operate to monitor the consumed electricity.

Figure 4:
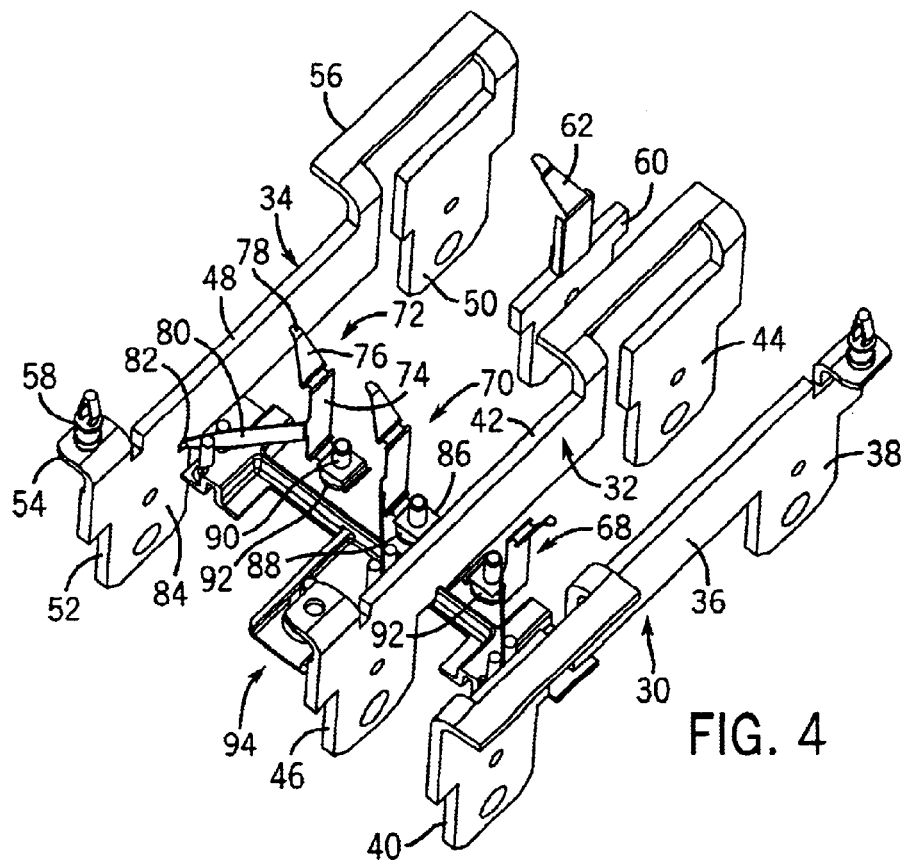
FIG. 4 is a top perspective view of the bus bars and test switch member of the present invention.

Referring now to FIG. 4, each of the bus bars 30, 32 and 34 include a standoff tab 54 and a support flange 56. As can be seen in FIGS. 3 and 4, the standoff tab 54 receives a non-conductive standoff member 58 such that the main body of each bus bar is spaced above the attachment surface 28 of the circuit board 26, as shown in FIG. 3.

Each of the bus bars 30, 32 and 34 is supported along the attachment surface 28 of the circuit board 26 by the support flange 56. The support flange 56 is preferably in contact with the attachment surface 28 of the circuit board 26 such that the circuit board 26 and the three bus bars 30, 32 and 34 are in a known relationship with each other. The support flanges 56 are positioned beneath coils embedded in the circuit board such that the measurement circuit mounted to the opposite surface of the circuit board 26 can sense the current flow through the bus bars. Such a current sensing system is shown in U.S. Pat. No. 6,414,475, the disclosure of which is incorporated by reference. The electrical connection between the circuit board 26 and the three bus bars 30, 32 and 34 will be described in greater detail below.

Referring back to FIGS. 3 and 4, an additional sensing blade 60 is shown as being included in the electricity meter of the present invention. As shown in FIG. 2, the sensing blade 60 extends through the base plate 22 and provides an additional point of connection between the electricity meter 10 and the socket into which the electricity meter is installed. Although a single sensing blade 60 is shown, the electricity meter could include additional sensing blades depending upon the meter configuration.

Referring back to FIG. 3, the voltage blade 60 includes a flexible contact arm 62 that is shown in contact with an electrical trace 64 formed on the attachment surface 28 of the circuit board 26. The voltage blade 60 is supported by the base plate 22 and is shown in FIGS. 3 and 4 as being suspended. It should be understood that the voltage blade is, in actuality, supported by the base plate 22 of the meter and FIGS. 3 and 4 show the voltage blade for illustrative purposes only.

During normal operation of the electricity meter of the present invention, the individual blades on the three bus bars 30, 32 and 34 are inserted into a socket which in turn is coupled to the supply of electricity being supplied to the residential or industrial facility being monitored. The configuration of the blades, as shown best in FIG. 2, is dictated by the type of socket into which the meter 10 will be installed. It should be understood that if different types of sockets are used, the actual configuration of the blades for the three bus bars may be modified. Additionally, the base plate 22 includes a series of aligned slots 66 positioned between the two rows of blades. The slots 66 can receive different combinations of projecting blades such that the electricity meter 10 of the present invention can be specifically configured depending upon the utility requirement.

Referring back to FIGS. 3 and 4, each of the bus bars 30, 32 and 34 is in contact with a contact member that provides an electrical interconnection between the individual bus bar and the circuit board 26. The contact members allow the operating control circuit contained on the circuit board 26 to monitor and display the amount of electricity utilized by the facility over each of the three phases of the electricity supply.

Referring specifically to FIG. 4, the first bus bar 30 is in contact with a first contact member 68, while the second bus bar 32 is in contact with a second contact member 70 and the third bus bar 34 is in contact with a third contact member 72. In the embodiment of the invention illustrated in FIGS. 3 and 4, the first, second and third contact members 68, 70 and 72, respectively, are the same type of component, and as such, only a single description of one of the contact members will be included, with the understanding that the same description applies for all of the contact members illustrated.

Referring now to FIG. 3, each of the contact members includes a main body 74. As shown in FIG. 3, the main body 74 is generally perpendicular to the circuit board 27. As shown in FIG. 4, the main body 74 is formed integrally with a contact tab 76 that defines a first end 78. The first end 78 of the contact tab 72 is configured to contact an electrical trace (not shown) contained on the circuit board 26.

Each of the contact members also includes a flexible finger 80 that extends at an angle relative to the main body 74. In the preferred embodiment of the invention, each of the contact members is formed from a metallic material, such that the flexible finger 80 has material memory and is biased into the position shown in FIG. 4. When the flexible finger 80 is in its biased, relaxed position shown in FIG. 4, a second end 82 of the contact member 72 is in contact with a flat face surface 84 of the third bus bar 34. Thus, when the flexible finger 80 is in the relaxed, biased position shown in FIG. 4, the second end 82 of the flexible finger provides a point of electrical contact with the third bus bar 34. Since the third contact member 72 is formed from a metallic, conductive material, electricity can flow from the third bus bar 34, through the flexible finger 80 and ultimately to the circuit board through the first end 78 formed on the contact tab 76. Since each of the contact members 68, 70 and 72 are formed having a similar configuration, during normal operating conditions, the contact members 68, 70 and 72 provide an electrical interconnection between the bus bars 30, 32 and 34 and the circuit board 26 shown in FIG. 3.

Referring back to FIG. 4, each of the contact members 68, 70 and 72 includes a testing flange 86. The testing flange 86 receives a connecting pin 88 formed from a conductive material. As can be seen in FIG. 3, each of the connecting pins 88 provide a point of connection to the respective contact member through the testing flange 86 formed on the contact member. Specifically, an external electrical connector can be positioned between the connecting pin 88 and the testing flange 86 such that a test signal can be applied directly to the contact members 68, 70 and 82 through the series of connecting pins 88.

Referring back to FIG. 2, the connecting pins 88 are each accessible from the exterior of the base plate 22 such that electrical connections can be made to the connecting pins 88 without opening the enclosed and sealed housing. Referring back to FIG. 4, each of the connecting pins 88 include a threaded shaft 90 connected to an expanded diameter head portion 92 such that an electrical wire can be entrapped between the head portion 92 and the testing flange 86.

Referring back to FIG. 3, the meter assembly of the present invention includes a test switch member 94 that is movable relative to the stationary bus bars 30, 32 and 34 as indicated by arrow 96. Specifically, the test switch member 94 is preferably formed from a molded plastic material and includes a pair of support flanges 96, 98 extending laterally from a main body 100. The support flange 96 rests upon an upper edge 102 of the first bus bar 30 while the opposite support flange 98 rests upon an upper edge 104 of the third bus bar 34. A center support flange 106 is received along the upper edge 108 of the second bus bar 32.

The test switch member 94 includes an extended handle portion 110 including a protruding actuating tab 112. As can be seen in FIG. 2, the actuating tab 112 extends through the base plate 22 and thus can be grasped by a user from external to the enclosed meter housing. As illustrated in FIGS. 2 and 3, indicator text 114 is printed along the handle portion 110 such that the position of the contact members can be determined from exterior to the enclosed housing. Referring back to FIG. 3, the test switch member 94 includes a pair of recessed channels 116 that receive corresponding protrusions (not shown) formed in the base member such that the test switch member is supported during its movement in the direction of arrow 96.

Figure 5:
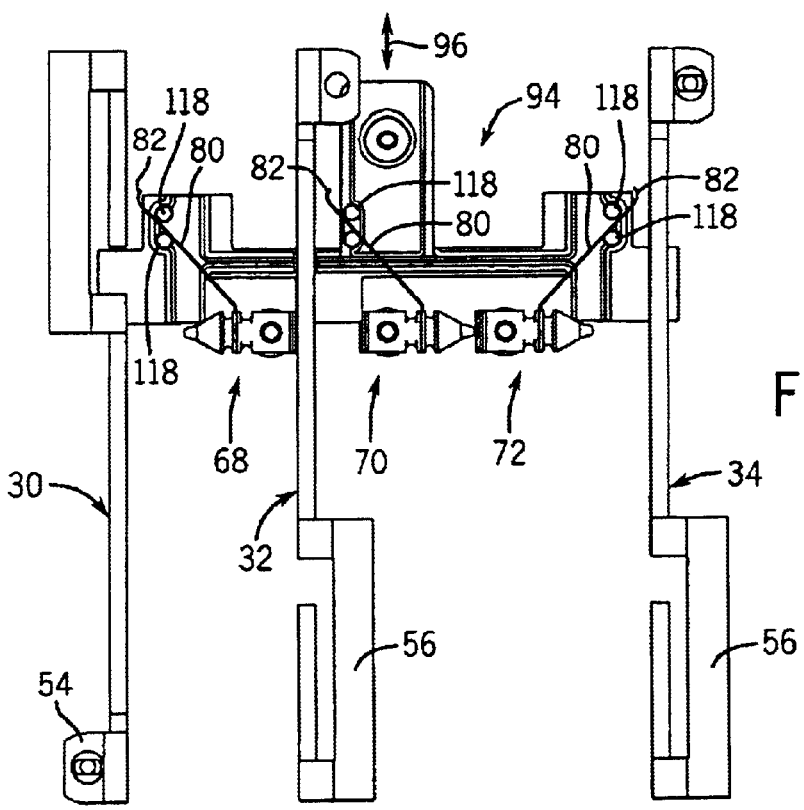
FIG. 5 is a top view illustrating the test switch in the test position.
Figure 6:
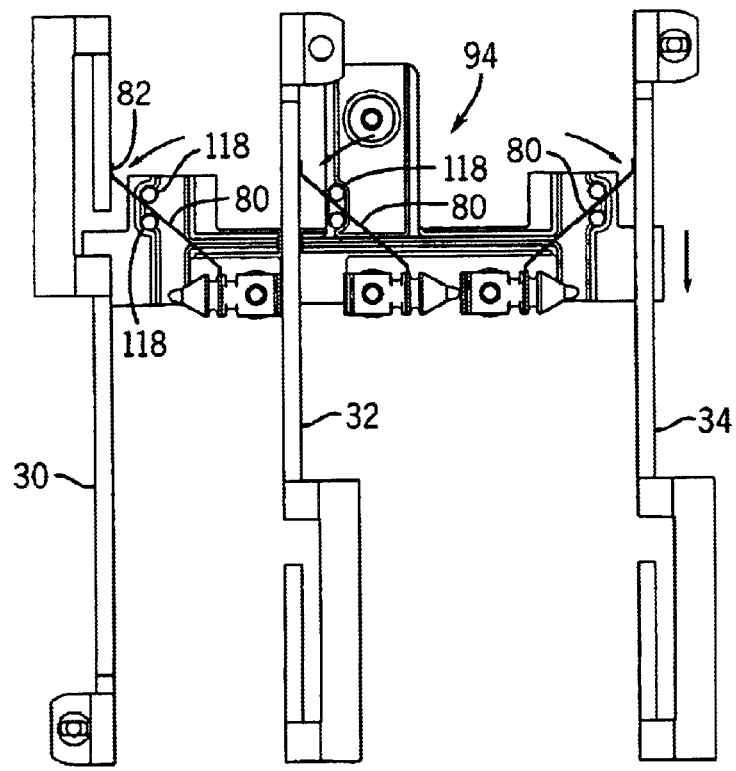
FIG. 6 is a top view illustrating the test switch member in the operating position.

Referring now to FIGS. 5 and 6, the test switch member 94 includes a plurality of protruding engagement posts 118. As can be seen in FIG. 5, the flexible finger 80 of each of the contact members 68, 70 and 72 is received between a pair of the engagement posts 118. When the test switch member 94 is in its test position, as shown in FIG. 5, the interaction between the engagement posts 118 and the flexible fingers 80 move the second end 82 of each flexible finger 80 away from contact with the respective bus bar 30, 32 and 34. Thus, when the test switch member 94 is in the test position shown in FIG. 5, the electrical contact between each of the contact members 68, 70 and 72 is broken with respect to the bus bars 30, 32 and 34.

When the test switch member 94 is in its test position shown in FIG. 5, two separate testing circuits can be used to test the meter of the present invention. Specifically, it is contemplated that when testing under ANSI standards, a high voltage, low amperage, three-phase supply voltage can be connected to each of the individual contact members 68, 70 and 72 through the respective connecting pins 88 formed on each of the contact members. At the same time, a separate low voltage, high current test source can be connected to the individual bus bars 30, 32 and 34 through the respective blades of each bus bar protruding through the back plate 22 shown in FIG. 2. Thus, to test the electricity meter 10 of the present invention, the actuating tab 112 is moved to the position shown in FIG. 2 such that the test switch member 94 separates the individual contact members 68, 70 and 72 from the bus bars 30, 32 and 34. When the test switch member 94 is in the test position shown in FIG. 5, the external testing circuits can be separately applied to the three connecting pins 88 and the individual blades for the bus bars, as best illustrated in FIG. 2.

Once testing is complete, the test switch member 94 is moved to the operating position shown in FIG. 6. When the test switch member 94 is in the operating position shown in FIG. 6, the engagement posts 118 allow the second end of each flexible finger 80 to be biased back into contact with the respective bus bar 30, 32 and 34. In this condition, the flexible fingers 80 provide electrical connection between the bus bars 30, 32 and 34 and the circuit board of the electricity meter.

As can be understood by the above disclosure, the movement of the single test switch member 94 between the test position (FIG. 5) and the operating position (FIG. 6) allows multiple test circuits to be used to test the operation of the electricity meter without opening the enclosed housing. Further, since the test switch member 94 interrupts the electrical connection between the circuit board and the bus bars, the electricity meter can be tested utilizing separate test equipment applied to the bus bars and the contact members.

Referring back to FIG. 3, the handle portion 110 of the test switch member 94 also includes a locking pin 120 that is accessible through a slot 121 in the base plate 22, as shown in FIG. 2. The locking pin 120 serves to lock the test switch member in either the test position or the operating position. The connecting pin thus provides an added level of insurance against accidental charges of the test switch setting.

Various alternatives and embodiments are contemplated as being within the scope of the following claims particularly pointing out and distinctly claiming the subject matter regarded as the invention.

We claim:

1. A three-phase electricity meter operable to measure and display an amount of consumed three-phase electricity, the meter comprising:
   a meter housing including a base member and a cover member;
   a measurement circuit board enclosed within the housing, the circuit board including a measurement circuit operable to determine the amount of consumed electricity;
   a first bus bar having a pair of blades extending through the housing and configured to receive the supply of three-phase electricity;
   a second bus bar having a second pair of blades extending through the housing and configured to receive the supply of three-phase electricity;
   a third bus bar having a third pair of blades extending through the housing and configured to receive the supply of three-phase electricity;
   a first contact member having a first end in contact with the circuit board and a second end in contact with the first bus bar;
   a second contact member having a first end in contact with the circuit board and a second end in contact with the second bus bar;
   a third contact member having a first end in contact with the circuit board and the second end in contact with the third bus bar; and
   a test switch member movable between a test position and an operating position, the test switch member being engaged with the first, second and third contact members such that when the test switch is moved to the test position, the second end of each of the contact members is moved out of contact with the first, second and third bus bars.

2. The electricity meter of claim 1 wherein the test switch member includes an actuating tab extending through the base member such that the actuating tab can be grasped to move the test switch member between the test position and the operating position.

3. The electricity meter of claim 1 wherein each of the flexible contact members include a flexible finger terminating with the second end of the flexible contact member, each flexible finger being biased into contact with one of the bus bars and engaged by the test switch member.

4. The electricity meter of claim 1 wherein each of the flexible contact members include a connection pin, each connection pin being accessible from the exterior of the meter housing.

5. The electricity meter of claim 3 wherein the test switch member includes a plurality of engagement posts, wherein each of the flexible fingers on the contact members are received between two of the engagement posts such that the engagement posts move the flexible fingers away from the bus bars when the test switch member is moved to the test position.

6. The electricity meter of claim 1 wherein the test switch member includes a locking pin accessible from the exterior of the enclosed meter housing.

7. The electricity meter of claim 1 wherein the test switch member is formed from a generally non-conductive material.

8. The electricity meter of claim 1 further comprising a plurality of contact blades supported in the housing, each contact blade having a flexible contact arm, wherein the flexible contact arm is biased into contact with the circuit board.

9. The electricity meter of claim 1 wherein the test switch member includes at least a pair of support flanges, each of the support flanges being positioned in contact with one of the bus bars such that the test switch member is supported along the bus bars.

10. The electricity meter of claim 4 wherein each of the connection pins are configured to receive a test voltage and the bus bars are configured to receive a test current when the test switch member is in the test position.

11. An electricity meter operable to measure and display an amount of consumed electricity, the meter comprising:
   an enclosed meter housing including a base member and a cover member;
   a measurement circuit board enclosed within the housing, the measurement circuit board providing a mounting platform for a measurement circuit operable to provide a measured value of consumed electricity;
   a plurality of bus bars each having at least one blade extending through the meter housing and configured to receive the electricity;
   a plurality of contact members, each contact member having a first end in contact with the circuit board and a flexible finger biased into contact with one of the bus bars such that the flexible contacts provide an electrical connection between the bus bars and the circuit board; and
   a test switch member configured to engage each of the flexible fingers of the plurality of contact members, the test switch member being movable between a test position and an operating position, wherein when the test switch member is in the test position, all of the flexible fingers are out of contact with the bus bars.

12. The electricity meter of claim 11 wherein the test switch member includes an actuating tab extending through the meter housing such that the test switch member can be moved between the test position and the operating position from external to the meter housing.

13. The electricity meter of claim 11 wherein each of the contact members include a connection pin, each connection pin being accessible from the exterior of the meter housing.

14. The electricity meter of claim 11 wherein the test switch member includes a plurality of engagement posts, wherein each of the flexible fingers of the contact members are received by two of the engagement posts such that the engagement posts move the flexible fingers away from the bus bars when the test switch member is moved to the test position.

15. The electricity meter of claim 11 wherein the test switch member includes a locking pin accessible from the exterior of the housing.

16. The electricity meter of claim 11 wherein the test switch member is formed from a generally non-conductive material.

17. The electricity meter of claim 11 wherein the electricity meter includes three bus bars and three flexible contact members.

* * * * *